US012704785B2

(12) United States Patent
Huli et al.

(10) Patent No.: US 12,704,785 B2
(45) Date of Patent: Aug. 11, 2026

(54) POINT OF USE SOLVENT MIXING FOR FILM REMOVAL

(71) Applicant: Tokyo Electron Limited, Tokyo (JP)

(72) Inventors: Lior Huli, Delmar, NY (US); Corey Lemley, Troy, NY (US)

(73) Assignee: Tokyo Electron Limited, Tokyo (JP)

( * ) Notice: Subject to any disclaimer, the term of this patent is extended or adjusted under 35 U.S.C. 154(b) by 1082 days.

(21) Appl. No.: 17/691,886

(22) Filed: Mar. 10, 2022

(65) Prior Publication Data

US 2022/0334485 A1 Oct. 20, 2022

Related U.S. Application Data

(60) Provisional application No. 63/175,126, filed on Apr. 15, 2021.

(51) Int. Cl.

| | |
|---|---|
| ***G03F 7/32*** | (2006.01) |
| ***G03F 7/00*** | (2006.01) |
| ***G03F 7/16*** | (2006.01) |
| ***H10P 50/28*** | (2026.01) |
| *H10P 76/20* | (2026.01) |

(52) U.S. Cl.

CPC .......... *G03F 7/162* (2013.01); *G03F 7/70975* (2013.01); *H10P 50/287* (2026.01); *H10P 76/2041* (2026.01)

(58) Field of Classification Search

CPC ......... G03F 7/32; G03F 7/3021; G03F 7/3028

See application file for complete search history.

(56) References Cited

U.S. PATENT DOCUMENTS

| | | | | |
|---|---|---|---|---|
| 7,142,300 | B2 | 11/2006 | Rosengaus | |
| 7,247,209 | B2 | 7/2007 | Robertson et al. | |
| 7,247,575 | B2 | 7/2007 | Cheng et al. | |
| 7,684,611 | B2 | 3/2010 | Simpkins | |
| 8,641,831 | B2 | 2/2014 | Benson | |
| 9,508,558 | B2 | 11/2016 | Lin | |
| 2016/0056049 | A1 | 2/2016 | Lin | |
| 2018/0046086 | A1 * | 2/2018 | Waller | G03F 7/168 |
| 2020/0338510 | A1 | 10/2020 | Nasman et al. | |

FOREIGN PATENT DOCUMENTS

| | | | | |
|---|---|---|---|---|
| JP | 2007-324393 | * 12/2007 | | H01L 21/30 |
| KR | 20010057590 | A | 7/2001 | |
| KR | 100733650 | B1 | 6/2007 | |

(Continued)

OTHER PUBLICATIONS

English Translation of JP 2007-324393 (Year: 2007).*

(Continued)

*Primary Examiner* — Daborah Chacko-Davis

(74) *Attorney, Agent, or Firm* — Slater Matsil, LLP

(57) ABSTRACT

A method of processing a wafer that includes: positioning the wafer within a processing chamber, the wafer including a film deposited over a surface of the wafer; rotating the wafer within the processing chamber; mixing a first fluid with a second fluid at a mixing ratio using a dispense nozzle assembly resulting in a fluid mixture; and while rotating the wafer, dispensing the fluid mixture from the dispense nozzle assembly over an edge portion of the wafer to remove a portion of the film on the edge portion of the wafer.

18 Claims, 8 Drawing Sheets

(56) References Cited

FOREIGN PATENT DOCUMENTS

| | | | |
|---|---|---|---|
| KR | 101323911 | B1 | 10/2013 |
| TW | 201608014 | A | 3/2016 |
| TW | I527528 | B | 4/2016 |
| TW | I546376 | B | 8/2016 |

OTHER PUBLICATIONS

Lee et al., "A new fabrication process for uniform SU-8 thick photoresist structures by simultaneously removing edge bead and air bubbles," Journal of Micromechanics and Microengineering, Nov. 3, 2011, 10 pages total.

* cited by examiner

POINT OF USE SOLVENT MIXING FOR FILM REMOVAL

CROSS-REFERENCE TO RELATED APPLICATIONS

This application claims the benefit of U.S. Provisional Application No. 63/175,126, filed on Apr. 15, 2021, which application is hereby incorporated herein by reference.

TECHNICAL FIELD

The present invention relates generally to a method and system of processing a wafer, and, in particular embodiments, to point-of-use solvent mixing in film removal process.

BACKGROUND

Generally, a semiconductor device, such as an integrated circuit (IC) is fabricated by sequentially depositing and patterning layers of dielectric, conductive, and semiconductor materials over a wafer to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working wafer. Spin coating is a technique widely employed in industry to deposit films, for example a photoresist, uniformly on wafers.

However, spin coating of a film on a wafer can result in a bead, hump or thickening of the film material at the edge of the wafer. These non-uniform features of the film at the edge of the wafer is often detrimental to subsequent processing such as photolithography and may lead to a yield loss. Issues caused by the edge bead may include bubbling during a soft bake and focus offset during a photolithographic exposure. Therefore, it is important to remove these features from the edge of the wafer by edge bead removal (EBR) process.

SUMMARY

In accordance with an embodiment of the present invention, a method of processing a wafer that includes: positioning the wafer within a processing chamber, the wafer including a film deposited over a surface of the wafer; rotating the wafer within the processing chamber; mixing a first fluid with a second fluid at a mixing ratio using a dispense nozzle assembly resulting in a fluid mixture; and while rotating the wafer, dispensing the fluid mixture from the dispense nozzle assembly over an edge portion of the wafer to remove a portion of the film on the edge portion of the wafer.

In accordance with an embodiment of the present invention, a method of processing a wafer that includes: performing a spin-on process to deposit a photoresist film over the wafer; rotating the wafer in a processing chamber; positioning a dispense nozzle assembly over an edge portion of the wafer, the dispense nozzle assembly including a mixing chamber and a dispense nozzle; supplying a first fluid to the mixing chamber through a first supply line at a first flow rate; supplying a second fluid to the mixing chamber through a second supply line at a second flow rate; mixing the first fluid with the second fluid at a mixing ratio within the mixing chamber to form a fluid mixture, the mixing ratio being a volumetric ratio of the first fluid to the second ratio; and while rotating the wafer, dispensing the fluid mixture using the dispense nozzle over an edge portion of the wafer to remove a portion of the photoresist film on the edge portion of the wafer.

In accordance with an embodiment of the present invention, an edge bead removal (EBR) apparatus including: a processing chamber; a wafer chuck configured to support and rotate a wafer; a dispense nozzle assembly including; a mixer configured to receive fluids for mixing; and a nozzle positioned proximate to the mixer to receive the mixed fluids for dispensing; a microprocessor; and a memory having a program to be executed in the microprocessor, the program including instructions to: position the wafer within the processing chamber, the wafer including a film deposited over a surface of the wafer; rotate the wafer within the processing chamber; mix the first fluid with the second fluid at a mixing ratio in the mixer resulting in a fluid mixture, the mixing being performed at a processing temperature; and while rotating the wafer, perform an EBR process by dispensing the fluid mixture from the nozzle over an edge portion of the wafer to remove a portion of the film on the edge portion of the wafer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1B illustrate schematic views of a conventional edge bead removal (EBR) apparatus capable of dispensing a single solvent, wherein FIG. 1A illustrates a cross-sectional view, and FIG. 1B illustrates a perspective view;

FIGS. 2A-2B illustrate schematic views of an EBR apparatus capable of mixing two solvents in accordance with various embodiments, wherein FIG. 2A illustrates a cross-sectional view, and FIG. 2B illustrates a perspective view;

FIGS. 6A-6C illustrate process flow charts of an EBR process in accordance with various embodiments, wherein FIG. 6A illustrates an embodiment, FIG. 6B illustrates another embodiment, and FIG. 6C illustrates alternate embodiments.

DETAILED DESCRIPTION OF ILLUSTRATIVE EMBODIMENTS

This application relates to a method and system of processing a wafer, more particularly to point-of-use solvent mixing in edge bead removal (EBR) process. In a typical EBR process, a single solvent may be dispensed from a nozzle onto the edge of a wafer to dissolve and remove the edge bead of a film deposited on the wafer. However, the inventors of this application identified that some solvents are less effective at removing the edge bead depending on the film type, for example, due to forming a hump of the film during the EBR process. This hump that may be formed as a result of a non-ideal EBR process is referred to as an EBR hump in this disclosure. Although it is important to select an effective solvent composition for an EBR process to eliminate or minimize EBR hump, the optimal EBR solvent composition may be different for different film types. It can be therefore expensive and impractical to switch the solvent entirely for each EBR process recipe. Furthermore, the EBR solvent is often used for other processes such as a spin-on coating, which makes it harder to adjust the EBR solvent composition without impacting the other process performance. Therefore, a new EBR solvent delivery system may be desired to enable fine tuning of the EBR solvent composition. Embodiments of the present application disclose methods of point-of-use solvent mixing in EBR process. In various embodiments, techniques herein include methods and systems to improve EBR by mixing solvents at a mixing ratio, or by changing the mixing ratio while dispensing the solvent mixture, that effectively eliminates the edge hump on a spin-coated film.

In the following, a conventional EBR apparatus with a single solvent delivery and issue of EBR hump formation is first introduced referring to FIGS. 1A-1B. An example EBR apparatus that enables point-of-use solvent mixing to overcome the EBR hump issue in accordance with various embodiments is then described referring to FIGS. 2A-2B and 3. Next, the effect of solvent type on EBR hump formation is described referring to FIGS. 4 and 5, demonstrating the benefit of mixing solvents in improving EBR. Example process flow diagrams of an EBR process in various embodiments are illustrated in FIGS. 6A-6C. All figures in this disclosure are drawn for illustration purpose only and not to scale, including the aspect ratios of features. In this disclosure, a solvent may be any fluid that can be used for an EBR process regardless of its ability to dissolve a particular film material.

Figure 1A:
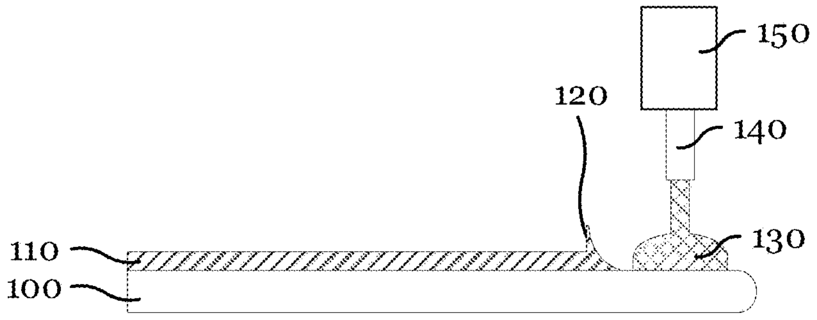

FIG. 1A illustrates a cross section view of a conventional edge bead removal (EBR) apparatus and a wafer 100.

Figure 1B:
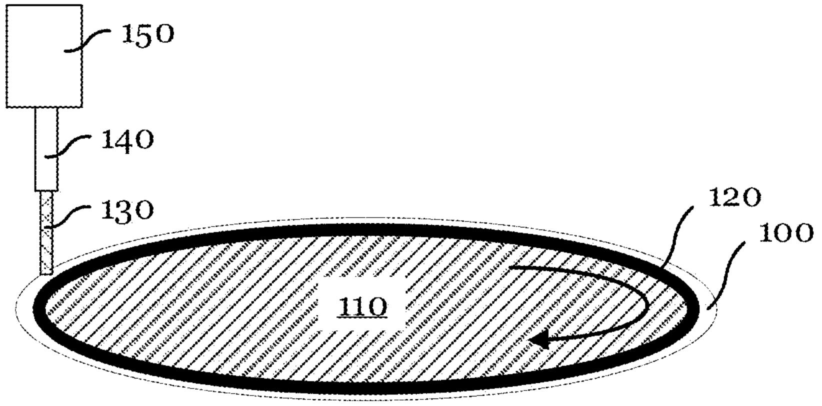

FIG. 1B illustrates a perspective view of the conventional EBR apparatus and the wafer 100 of FIG. 1A.

A conventional EBR process is performed to process a wafer 100 having a film 110 coating the surface of the wafer 100, and remove edge bead of the film 110 at the edge portion of the wafer 100 as illustrated in FIGS. 1A and 1B. The removal of edge bead of the film 110 is achieved by dispensing a solvent 130 from a single solvent source 150 through a nozzle 140 onto the edge portion of the wafer 100. The inventors of this application identified the formation of an EBR hump 120 on the edge of the film 110 after the EBR process depending on the solvent composition and the film type. The inventors of this application also discovered that the EBR hump 120 may impact the fidelity of the subsequent processes such as photolithography and thereby cause manufacturability edge yield issues. To avoid the EBR hump issue, the capability of efficiently tuning the EBR solvent composition may be desired for an EBR apparatus but the conventional EBR apparatus as illustrated in FIGS. 1A and 1B are not configured to enable such tuning as identified by the inventors of this application. In addition, the single solvent source 150 is often shared among various processes performed on a coater-developer tool, making it more challenging to optimize the EBR solvent composition without affecting the other processes such as spin-on coating process.

Figure 2A:
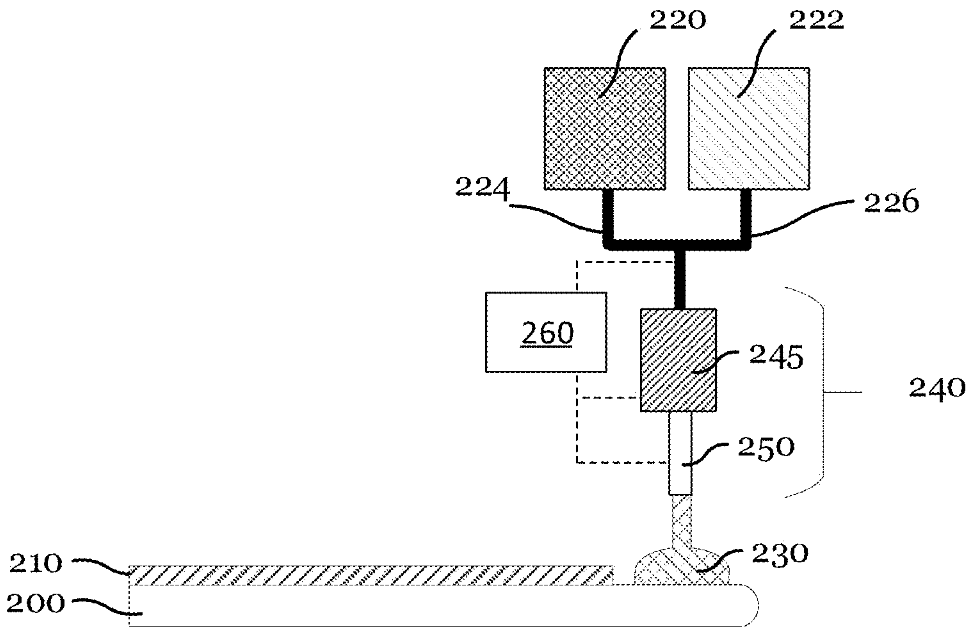

FIG. 2A illustrates a cross-sectional view of an EBR apparatus capable of point-of-use mixing two solvents and a wafer 200 in accordance with various embodiments.

Figure 2B:
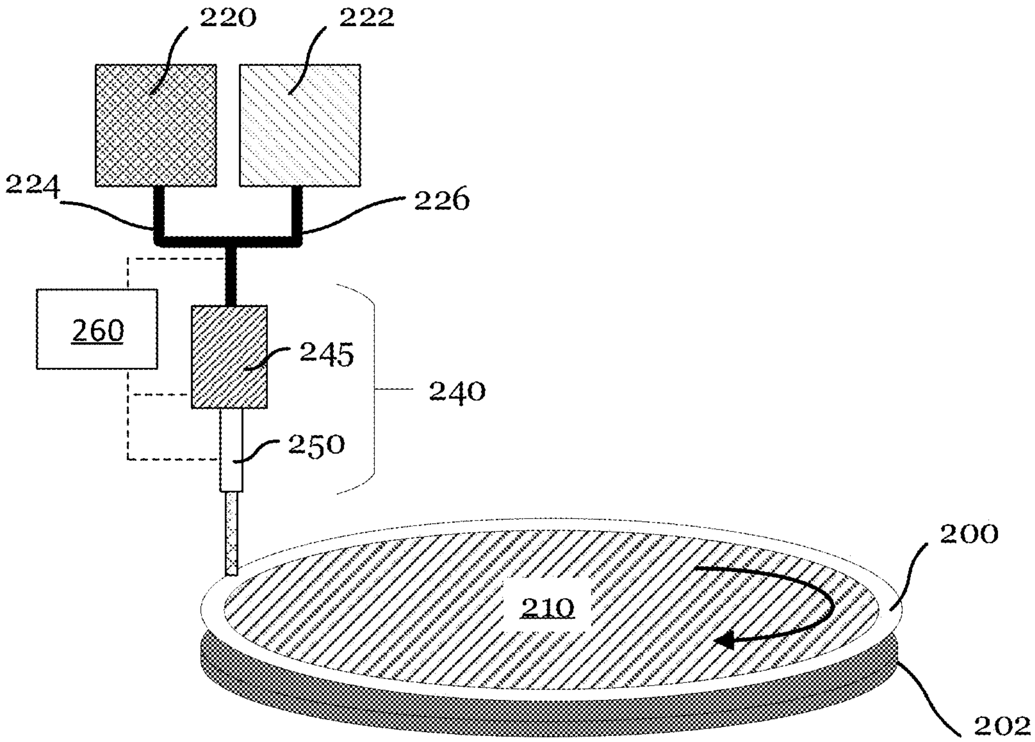

FIG. 2B illustrates a perspective view of the EBR apparatus and the wafer 200 of FIG. 2A.

An edge bead removal (EBR) apparatus described in this disclosure can overcome the EBR hump issue described above by providing the point-of-use solvent mixing capability. For example, when two solvents are mixed using the EBR apparatus, an EBR hump (e.g., 400 nm or height in a single solvent dispensing method) of a film 210 may be reduced to 20 nm or completely removed. As illustrated in FIGS. 2A and 2B, the EBR apparatus may comprise two solvent sources (i.e., a first solvent source 220 for a first solvent and a second solvent source 222 for a second solvent), a nozzle assembly 240, and a controller 260. In various embodiments, the nozzle assembly 240 may comprise a mixer 245 and a dispense nozzle 250. The design of this EBR apparatus enables mixing the first solvent and the second solvent at the nozzle assembly 240 to form a solvent mixture 230, and then depositing the solvent mixture 230 onto the edge of the wafer for EBR. In various embodiments, the first solvent may be a primary solvent used for various processes such as spin-on coating of the film 210, and the first solvent source 220 may be configured to supply the first solvent for such processes in addition to the EBR process. The second solvent may be used to improve the effectiveness of the primary solvent in EBR. In various embodiments, the controller 260 may be configured to control a mixing ratio of the two solvents, each of the flow rates of the two solvents, a position of the nozzle assembly 240, and a dispensing rate among others. The EBR apparatus can mix solvents at ratios that are dynamically changing, phasing, or that are static.

In various embodiments, a wafer 200 to be processed by the EBR apparatus may be a part of, or include, semiconductor device, and may have undergone a number of steps of processing following, for example, a conventional spin-on coating process. The wafer 300 accordingly may comprise various semiconductor regions for forming active semiconductor regions as well as other regions for interconnecting the active regions and isolating regions.

In one or more embodiments, the wafer 200 may be a silicon wafer, or a silicon-on-insulator (SOI) wafer. In certain embodiments, the wafer 200 may comprise a silicon germanium wafer, silicon carbide wafer, gallium arsenide wafer, gallium nitride wafer and other compound semiconductors. In other embodiments, the wafer 200 comprises heterogeneous layers such as silicon germanium on silicon, gallium nitride on silicon, silicon carbon on silicon, as well layers of silicon on a silicon or SOI substrate. In various embodiments, the wafer 200 is patterned or embedded in other components of the semiconductor device. In one or more embodiments, the wafer 300 may have a diameter of 200 mm or 300 mm.

The EBR apparatus may further comprise a wafer chuck 202 configured to support and rotate the wafer 200. The wafer chuck 202 may be a vacuum chuck, electrostatic chuck (ESC), or other types. In various embodiments, the wafer chuck 302 is configured to rotate the wafer 200 at a rate between 0 rpm to 5000 rpm. The wafer chuck 202 may comprise any suitable material with a sufficient stiffness (e.g., a Young's modulus of 10 GPa or greater) to support the wafer 200. In certain embodiments, the wafer chuck 202 may comprise aluminum.

In various embodiments, the film 210 may comprise a photoresist to be patterned by a subsequent photolithographic process. In certain embodiments, the photoresist may be a positive photoresist, a negative photoresist, or a hybrid tone photoresist, and may comprise a mixture of any suitable photosensitive materials. In one example, the photoresist used for the film 210 may comprises phenol formaldehyde resin or a diazo-naphthoquinone (DNQ) based resin. In one or more embodiments, the photoresist may comprise a chemically amplified resist (CAR). In another embodiment, the photoresist may comprise a non-chemically amplified resist (non-CAR) material such as polymethyl methacrylate (PMMA) or hydrogen silsesquioxane (HSQ). In yet another embodiment, the photoresist may be a metal-oxide based photoresist.

The film 210 may be deposited over the wafer 200 from a solution by, for example, a conventional spin coating technique. In various embodiments, the spin coating of the film 210 may be performed in the same processing chamber or in the same track system used for the EBR process. The track system for the EBR process may be an automated track system that includes wafer handling equipment. The wafer handling equipment may be configured to transport the wafers between the various operation stations (e.g., photolithography), which may comprise, for example, resist spin coat, develop, baking and chilling stations. Because robotic handling of the wafers can minimize particle generation and wafer damage, using the automated track system for the spin coating of the film 210 and the EBR may advantageously improve the overall process efficiency. The automated track system may also enable simultaneously performing various processing operations. Furthermore, in certain embodiments, the spin coating of the film 210 may be performed using the first solvent supplied from the first solvent source 220. In one embodiment, both the spin coating of the film 210 and the EBR process may use a first solvent mixture comprising 50-80% propylene glycol monomethylether (PGME) and 20-50% propylene glycol monomethylether acetate (PGMEA), while the EBR process further uses a secondary solvent to be added to the first solvent mixture using the EBR apparatus described in this disclosure. In various embodiments, the mixing ratio for the first solvent may be based on volume.

Figure 3:
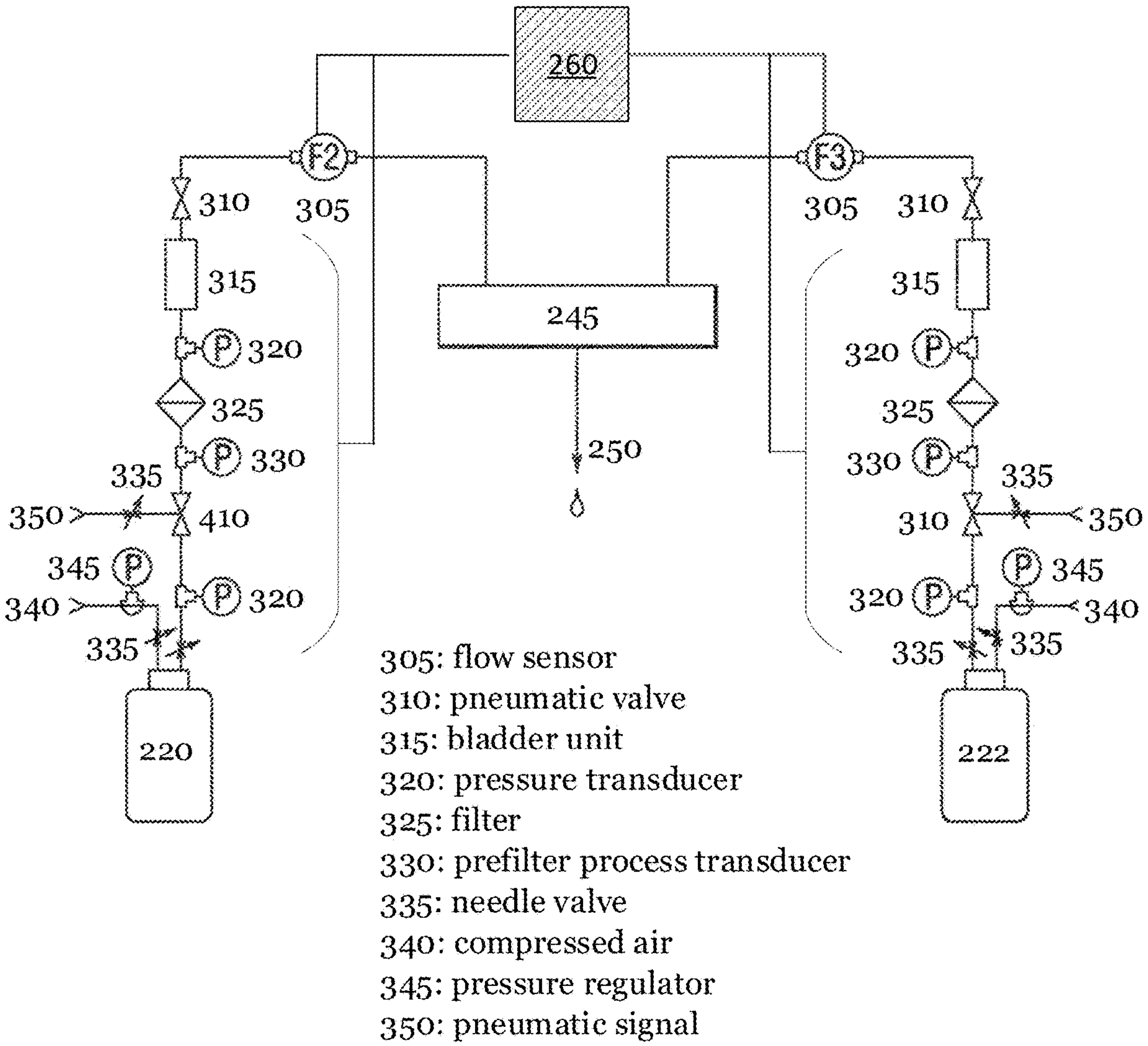
FIG. 3 illustrates a detailed schematic of an EBR apparatus in accordance with various embodiments.

FIG. 3 illustrates a detailed schematic of an EBR apparatus in accordance with various embodiments.

In FIG. 3, various components that enable the solvent delivery to the mixer 245 and the dispense nozzle 250 are illustrated as example, but the EBR apparatus may further comprise components not illustrated. In certain embodiments, not all the components illustrated in FIG. 3 may be necessary for an on tool production implementation of the EBR apparatus, thus there are many options and variations contemplated. The controller 260 may be configured to control the components illustrated in FIG. 3. Although the first solvent delivery system from the first solvent source 220 and the second solvent delivery system from the second solvent source 222 are illustrated as identical to each other in FIG. 3, the details of their components and configurations may be different to each other in certain embodiments.

In various embodiments, the mixer 245 may comprise a microfluidic mixer having channels with widths and depths measured in micrometers. In certain embodiments, the microfluidic mixer may be configured to mix solvents using slot-shaped fluid conduits. The small dimensions of such channels of the microfluidic mixer eliminate any possibility of turbulent mixing. Accordingly, flows mix entirely through diffusion in a completely laminar flow. The extremely short distance perpendicular to the flow for diffusion to take place provides rapid mixing. The length of the channel, combined with the flow rate of the solvent, determine the mix quality at the output of the channel in a predictable, repeatable way. A change in input flows will result in predictable, repeatable change in output concentration after passage through the channel. Accordingly, in various embodiments, the mixer 245 can provide a high accuracy of mixing with a variation of a fractional concentration of a solvent in the solvent mixture between 0.1% and 1%. With utilizing the microfluidic mixer, the EBR apparatus of this disclosure enables any mixing ratio ranging from 0.1%-99.9%. The dispense nozzle may be configured to dispense a small volume of solvent, for example, only 0.1 cc to 1.0 cc. These attributes are desired for point-of-use mixing for an EBR process.

EBR solvents can be blended using a microfluidic mixer for the mixer 245 and then held for dispensing in one embodiment. In alternate embodiments, the second solvent can be pulsed into the first solvent held in the mixer 245. Various other mixing modes can be configured. The mixer 245 may be a quartz mixer, and can be positioned adjacent to the dispense nozzle 250. For a cylindrical mixing chamber, a conical member can fill in a solvent dead zone at a top of the chamber.

Figure 4:
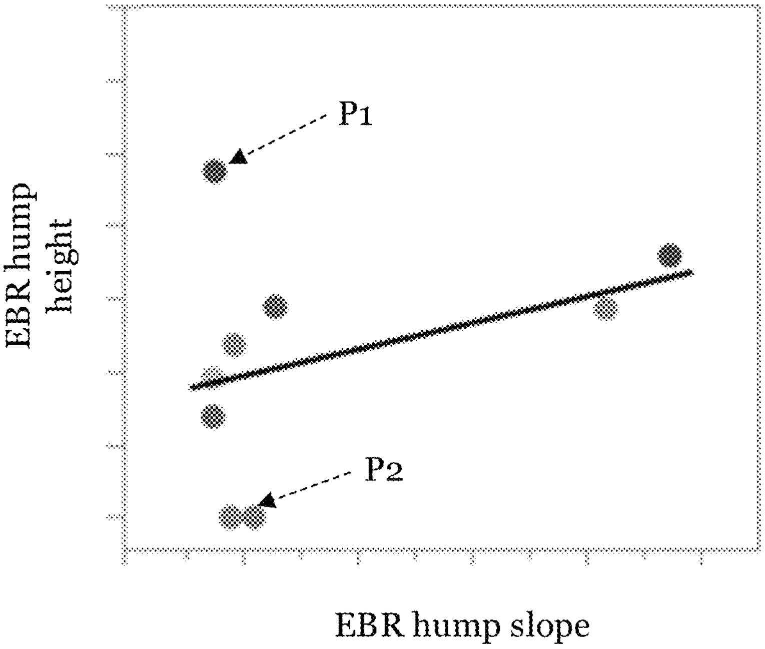
FIG. 4 illustrates a plot of EBR hump height and slope after an EBR process with various solvent systems in accordance with various embodiments.

FIG. 4 illustrates a plot of EBR hump height and slope (the ratio of the height to the width of EBR hump) after an EBR process with various solvent systems in accordance with various embodiments.

FIG. 4 illustrates that the height of EBR hump may depend on the solvent type and composition used for an edge bead removal (EBR) process. For example, when a single solvent of 70% propylene glycol monomethylether (PGME)/30% propylene glycol monomethylether acetate (PGMEA) mixture (P1 in FIG. 4) is used for EBR, the height of the hump at the edge of the film after the EBR process is >450 nm, the highest among the data presented in FIG. 4. On the other hand, when this primary solvent (70% PGME/30% PGMEA) is mixed with a secondary solvent at various ratio, the height of the hump is reduced. In particular, when mixed with γ-butyrolactone (GBL) at a mixing ratio of 50%:50% (P2 in FIG. 4), no hump formation is observed after the EBR process. The data demonstrates that mixing a primary solvent (e.g., 70% PGME/30% PGMEA) with a secondary solvent (e.g., GBL) can substantially improve EBR by eliminating or reducing EBR hump formation, thereby also reducing edge yield loss issue. It should be noted that while one mixture composition may be advantageous for EBR for a certain photoresist film, it may not be effective for other types of films (e.g., photoresist) or other fabrication processes such as a spin-on coating of a photoresist which may be performed in the same track system. Therefore, it may not be possible to switch the primary solvent (e.g., 70% PGME/30% PGMEA) entirely with the mixture with GBL only for an EBR process recipe. Various embodiments of this disclosure can overcome this issue by providing point-of-use mixing only for EBR, and also enable selecting an ideal mixture composition for each EBR process recipe. In certain embodiments, the spin-on coating may be performed using 50- 80% PGME/20-50% PGMEA, and the EBR process may be performed using 50-80% PGME/20-50% PGMEA and GBL so that both processes are optimized. Accordingly, various embodiments of EBR process may comprise selecting the first solvent and/or the second solvent for a given type of film to be removed in consideration of optimizing a series of processes, and further fine tuning the solvent composition before and/or during the EBR process. In one or more embodiments, the second solvent may comprise γ-butyrolactone (GBL), n-butyl acetate, or ethyl lactate.

Figure 5:
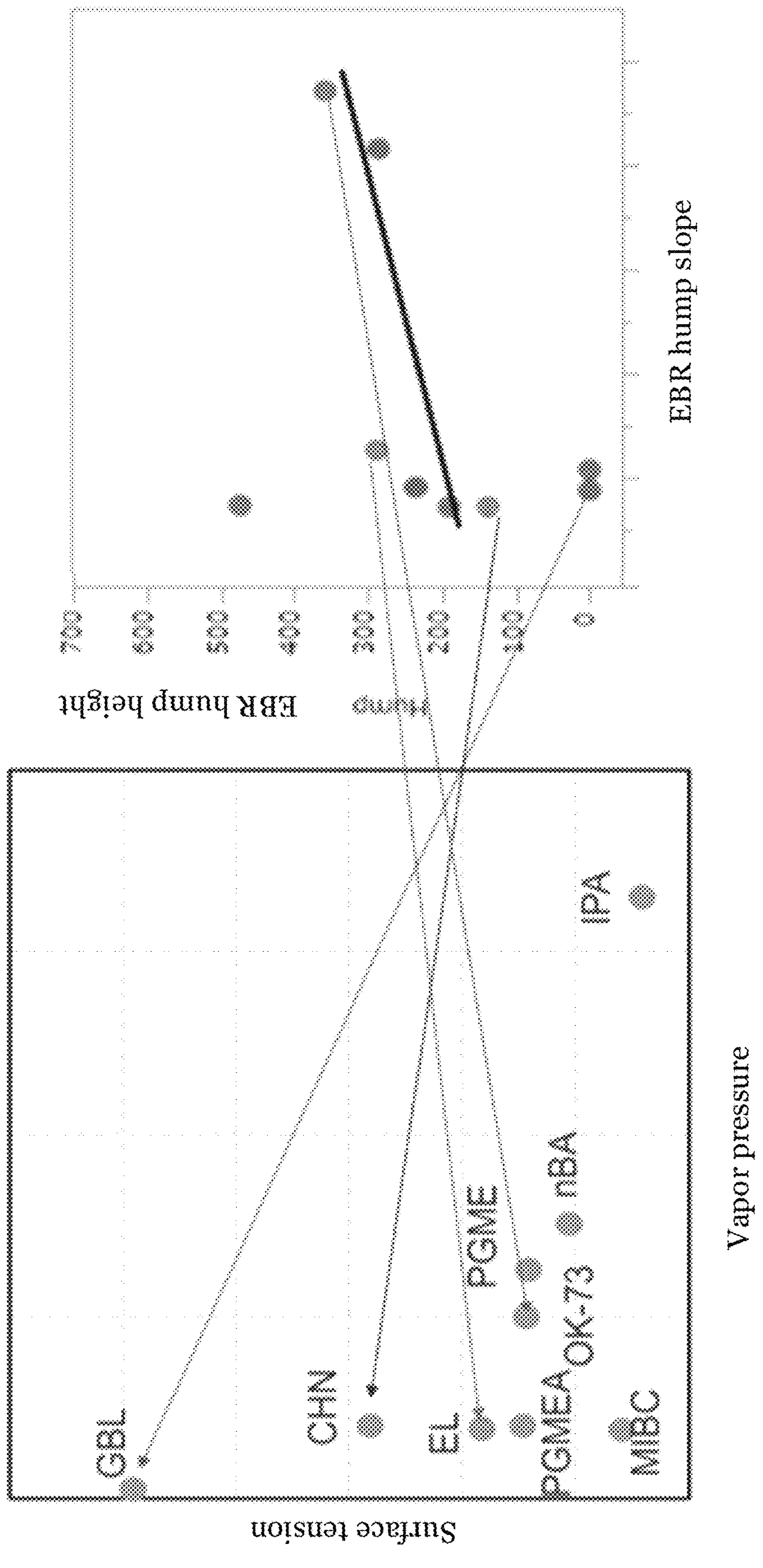
FIG. 5 illustrates a relationship between surface tension of solvent and EBR hump height after an EBR process for various solvents.
Figure 6A:
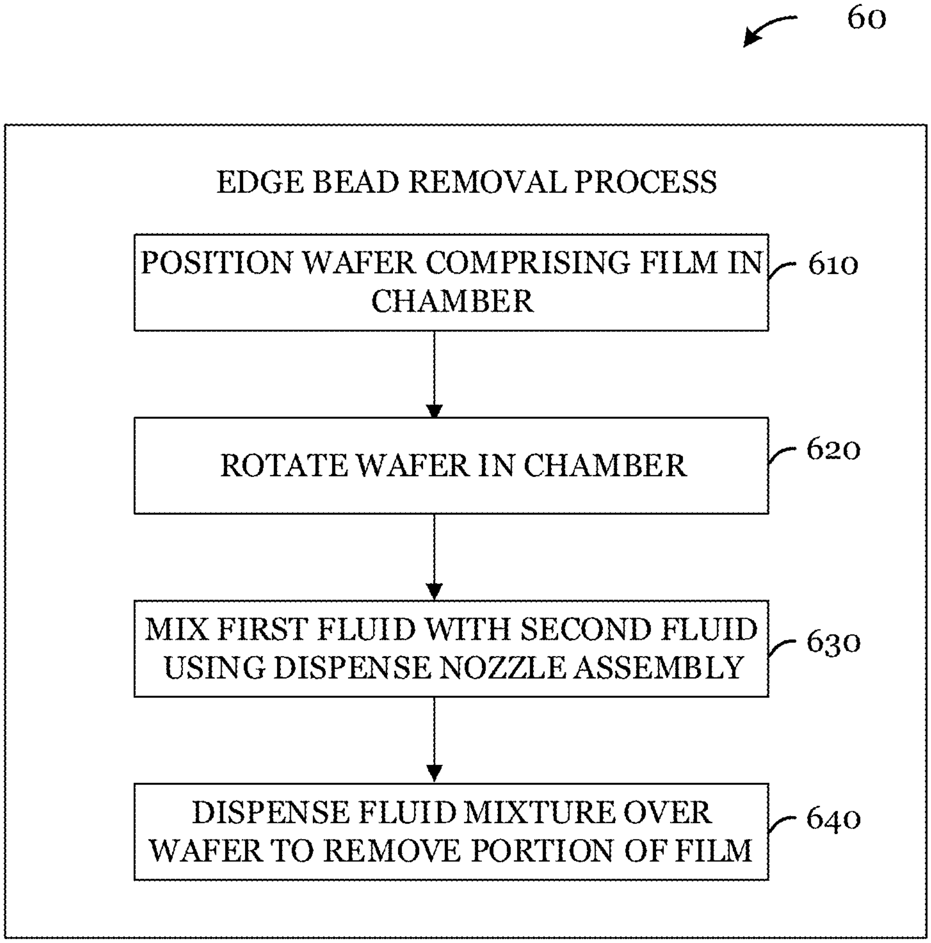
Figure 6B:
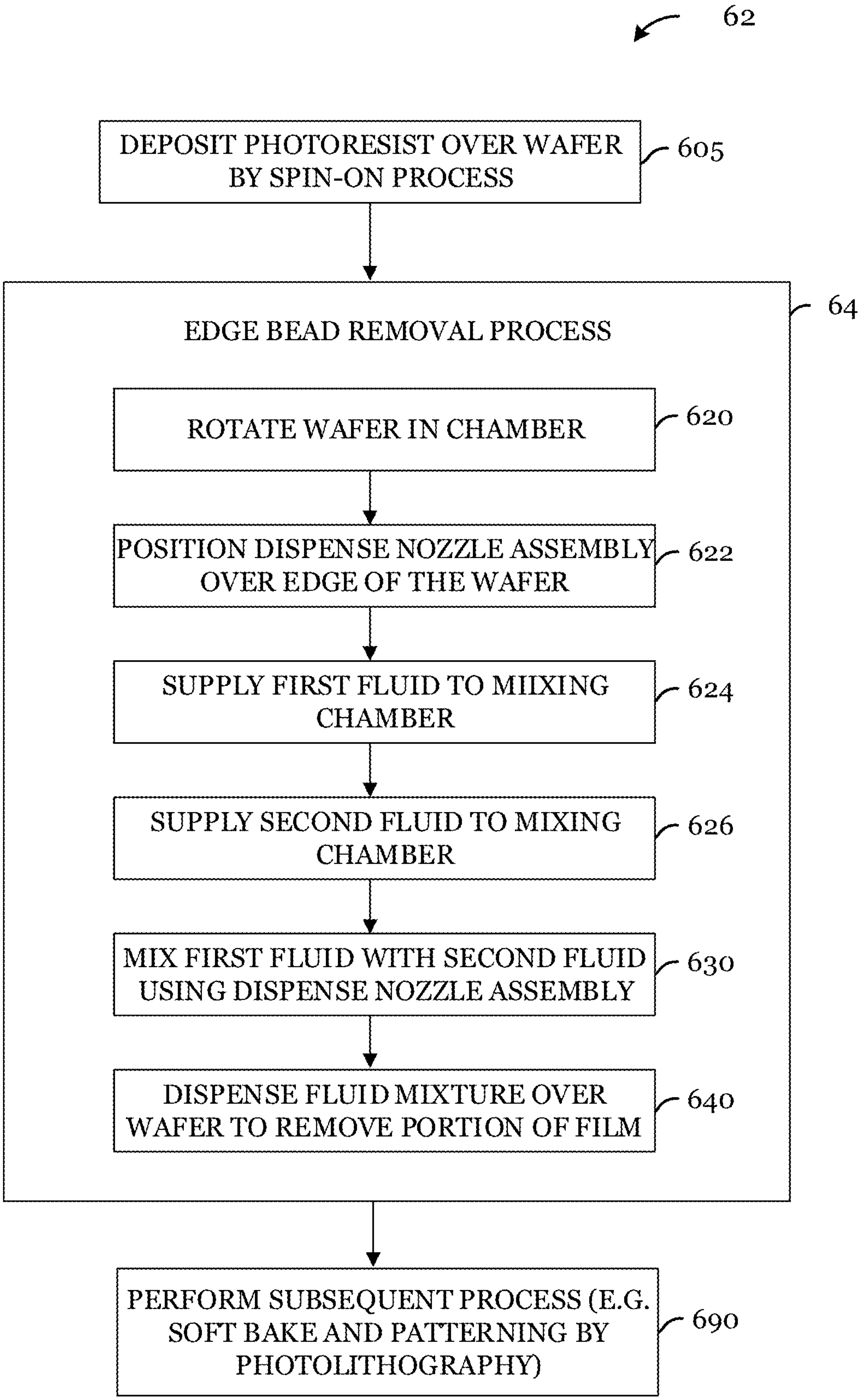
Figure 6C:
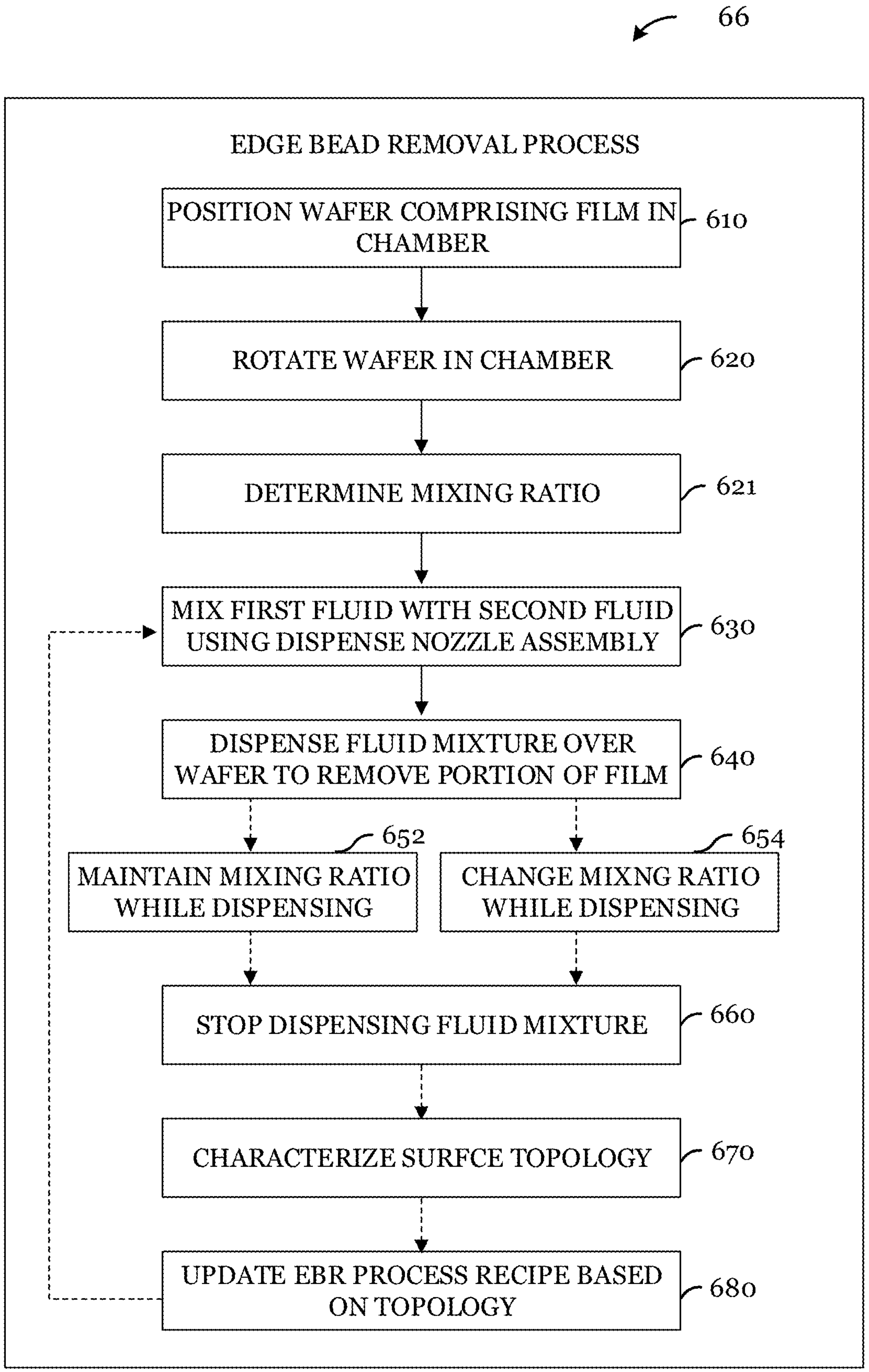

FIG. 5 illustrates a relationship between surface tension of solvent and EBR hump height after an EBR process for various solvents in accordance with various embodiments. A plot on the left illustrates a relationship between surface tension and vapor pressure for various solvents for EBR, and a plot on the right illustrates EBR hump height and slope for various solvents.

Selecting a solvent system effective for EBR may be guided by considering solvent properties. In particular, the inventors of this application identified that EBR hump formation during EBR may be inversely proportional to the surface tension of the solvent at air/liquid interface. The two plots of FIG. 5 collectively demonstrate that a solvent with high surface tension result in no or little EBR hump formation. For example, γ-Butyrolactone (GBL) has the highest surface tension about 45 [mN/m] in this example and does not cause any EBR hump. Accordingly, in various embodiments, the EBR process may comprise selecting a second solvent with a surface tension higher than that of a first solvent, and mixing the second solvent with the first solvent for improving the EBR by changing the surface tension of the first solvent. In certain embodiments, the EBR process may comprise selecting the first fluid with a surface tension between 10 mN/m and 30 mN/m (e.g., 70% PGME/30% PGMEA), and selecting the second fluid that with a surface tension between 30 mN/m and 60 mN/m (e.g., GBL). In alternate embodiments, selecting the solvent system and composition may be based on other solvent properties such as vapor pressure, viscosity, and wettability instead of or in combination of surface tension.

FIGS. 6A-6C illustrate process flow charts of an EBR process in accordance with various embodiments, wherein FIG. 6A illustrates an embodiment, FIG. 6B illustrates another embodiment, and FIG. 6C illustrates alternate embodiments.

In FIG. 6A, a process flow 60 of edge bead removal (EBR) starts with positioning a wafer comprising a film in a processing chamber that comprise an EBR apparatus (block 610). Next, the wafer is rotated at a spin speed in the processing chamber (block 620). In various embodiments, the spin speed for EBR may be slower than a spin speed for a typical spin-on coating process. In certain embodiments, the wafer is rotated at a rate between 500 rpm and 2000 rpm, or at a rate between 800 rpm and 1200 rpm in one embodiment. In one embodiment, the spin speed may be about 1000 rpm. A first fluid is then mixed with a second fluid at a mixing ratio using a dispense nozzle assembly resulting in a fluid mixture (block 630). In various embodiments, the order of rotating the wafer and mixing the two fluids may be flipped or they may be performed at the same time. While rotating the wafer, the fluid mixture is then dispensed from the dispense nozzle assembly over an edge portion of the wafer to remove a portion of the film on the edge portion of the wafer (block 640). In one or more embodiments, the dispense rate of the fluid mixture may be about 1 mL/s. In certain embodiments, the substrate may be kept at ambient temperature during EBR, but in other embodiments, may be controlled using a temperature controller. In one embodiment, the portion of the film to be removed by the EBR process may be within 2-5 mm from the edge of the wafer.

In FIG. 6B, a process flow 62 starts with depositing a photoresist film over a wafer by a spin-on coating process 605. A photoresist material may be dissolved in a solvent to prepare a photoresist solution, which is then dispensed from a nozzle to a central portion of the wafer. The photoresist solution onto the wafer may be dispensed either while the wafer is spun (i.e., dynamic dispense) or not (i.e., static dispense). The wafer is spun at a rate, for example, between 500 rpm and 4000 rpm, to exert a centrifugal force, which causes the photoresist solution to spread outwards and towards the edge of the wafer. As the solvent evaporates from the photoresist solution, the photoresist film may be formed over the wafer, coating the surface of the wafer uniformly. In certain embodiments, the solvent for the spin-on coating process may be a solvent also used for a subsequent EBR process. In one or more embodiments, the solvent for the spin-on coating process is a solvent mixture comprising 50-80% propylene glycol monomethylether (PGME) and 20-50% propylene glycol monomethylether acetate (PGMEA). The process conditions for the spin-on coating process 605 may comprise spin speed, spin time, solvent system, and temperature among others. In various embodiments, non-uniformity of the photoresist film at the edge portion (e.g., edge bead) may be formed as a result of the spin-on coating process 605.

After depositing the photoresist film, an EBR process 64 is performed to remove the edge bead of the photoresist film by first rotating the wafer in a processing chamber (block 620), followed by positioning a dispense nozzle assembly over an edge portion of the wafer (block 622). Next, a first fluid and a second fluid are supplied to a mixing chamber of the dispense nozzle assembly (blocks 624 and 626). The first fluid is then mixed with a second fluid at a mixing ratio using the dispense nozzle assembly resulting in a fluid mixture (block 630). While rotating the wafer, the fluid mixture is then dispensed from the dispense nozzle assembly over an edge portion of the wafer to remove a portion of the photoresist film on the edge portion of the wafer (block 640).

Once the EBR process 64 is complete, a subsequent process may be performed (block 690). In various embodiments, the subsequent process may comprise, for example, patterning the photoresist film by UV photolithography, where the wafer is exposed to an ultraviolet (UV) irradiation through a photomask. In certain embodiments, the subsequent process that immediately follows the EBR process 64 may be a soft bake, prior to the UV exposure, to thermally treat the wafer to remove residual solvents from the photoresist film. The soft bake process may comprise heating the photoresist film within a narrow temperature range, e.g., between 75° C. and 100° C. Performing the EBR process 64 immediately after the spin-on coating process 605 prior to soft bake may advantageously improve the process efficiency and prevent possible contamination and/or damage to the bake oven and handling arms for wafer transfer.

In various embodiments, the UV radiation for photolithography may comprise, for example, i-line (365 nm), g-line (435 nm), h-line (405 nm), or shorter wavelengths such as deep UV (DUV, e.g., 193 nm) and extreme UV (EUV, e.g., 13.5 nm). The photoresist film may be selected based on the type of UV lithography tool used for fabrication. The subsequent process may further comprise, after the UV exposure, performing a post-exposure bake (PEB), developing the photoresist film, and transferring the pattern of the photoresist film by etching an underlying layer using the photoresist film as an etch mask. The PEB step further removes residual solvents and increases structural rigidity or etch resistance of the photoresist film. In one embodiment, the PEB after the UV exposure may be performed at a higher temperature than the soft bake process and, for example, performed between 100° C. and 150° C. Developing refers to dissolving and removing a portion of the photoresist film to yield a relief pattern (topographic pattern). The portion of photoresist film removed by developing can be either irradiated regions or non-irradiated regions of the photoresist film depending on a photoresist tone and/or type of developing solvent used. The relief pattern of the remaining portion of the photoresist film can then function as an etch mask layer defining a pattern. Accordingly, in various embodiments, the process flow 82 comprising the EBR process 64 can be applied for fabricating a variety of semiconductor devices that involves a UV photolithographic process.

In FIG. 6C, a process flow 66 of edge bead removal (EBR) starts with positioning a wafer comprising a film in a processing chamber that comprise an EBR apparatus (block 610), followed by rotating the wafer in the processing chamber (block 620). A mixing ratio for a first fluid and a second fluid is then determined based on an EBR process recipe (block 621), and the first fluid is mixed with a second fluid at the mixing ratio using a dispense nozzle assembly resulting in a fluid mixture (block 630). While rotating the wafer, the fluid mixture is then dispensed from the dispense nozzle assembly over an edge portion of the wafer to remove a portion of the film on the edge portion of the wafer (block 640). In certain embodiments, while dispensing the fluid mixture, the mixing ratio may be maintained to be constant (block 652), but in other embodiments, it may be changed by dynamically controlling the delivery of the first fluid and the second fluid independent of each other (block 654). In one or more embodiments, changing the mixing ratio may be based on a surface topology of the film on the edge portion of the wafer so that EBR hump formation may be eliminated or minimized. In further embodiments, the EBR process may further comprise optional steps of stopping dispensing the fluid mixture (block 660), characterizing a surface topology of the film at the edge portion of the wafer (block 670), and updating the EBR process recipe based on the surface topology (block 680). For example, the surface topology of the film may be measured by scanning probe microscopy such as atomic force microscopy, and an EBR hump height may be determined. Other techniques for surface topology measurement include ellipsometry for coarse measurement, and electron microscopy (e.g., scanning electron microscopy and transmission electron microscopy), profilometry, and nanoindentation for fine measurement. In certain embodiments, measuring the surface topology of the film may be performed in the same chamber for the EBR process, or in a separate metrology system in other embodiments. In one embodiment, a threshold for the acceptable EBR hump height may be provided, and a decision for the next step of the EBR process may be made based on whether or not the EBR hump height is below the threshold. If the EBR hump height is below the threshold, the EBR process may be deemed complete and a subsequent process may be performed. If the EBR hump height is above the threshold, the EBR process may continue as a cyclic process by repeating mixing the two fluids and dispensing the fluid mixture. In certain embodiments, for each cycle of the cyclic process, an updated EBR process recipe comprising a new mixing ratio different from the initial mixing ratio may be used. In various embodiments, an EBR process recipe may comprise solvent system, mixing ratio, spin speed, dispense rate, temperature, and position of the nozzle assembly among others.

Accordingly, techniques herein enable a dynamically mixed solvent for edge bead removal (EBR) process by point-of-use solvent mixing in the EBR dispense nozzle assembly and enabling process control flexibility. The EBR methods described in this disclosure can adjust an EBR solvent composition just before it dispenses on the wafer, without having to entirely replace the primary solvent. Furthermore, the EBR apparatus enables dynamically changing the mixing ratio during the EBR process, which may be coupled with real-time monitoring of the EBR process (e.g., measurement of surface topology) so that the mixing ratio can be tuned to improve the EBR process while in operation. As a result, various embodiments of the EBR apparatus and method may improve EBR processes and reduce edge yield loss issues via elimination of the EBR hump issue.

Example embodiments are summarized here. Other embodiments can also be understood from the entirety of the specification as well as the claims filed herein.

Example 1. A method of processing a wafer that includes: positioning the wafer within a processing chamber, the wafer including a film deposited over a surface of the wafer; rotating the wafer within the processing chamber; mixing a first fluid with a second fluid at a mixing ratio using a dispense nozzle assembly resulting in a fluid mixture; and while rotating the wafer, dispensing the fluid mixture from the dispense nozzle assembly over an edge portion of the wafer to remove a portion of the film on the edge portion of the wafer.

Example 2. The method of example 1, further including performing a spin-on process to deposit the film over the wafer.

Example 3. The method of one of examples 1 or 2, further including, while dispensing the fluid mixture, changing the mixing ratio based on a surface topology of the film on the edge portion of the wafer.

Example 4. The method of one of examples 1 to 3, where the first fluid has a first fractional concentration in the fluid mixture based on the mixing ratio, where a variation of the first fractional concentration in the fluid mixture during the dispensing on the wafer is between 0.1% and 1%.

Example 5. The method of one of examples 1 to 4, further including selecting the second fluid that has a surface tension higher than that of the first fluid at a processing temperature at which the first fluid and the second fluid are being mixed.

Example 6. The method of one of examples 1 to 5, further including: selecting the first fluid that has a surface tension between 10 mN/m and 30 mN/m; and selecting the second fluid that has a surface tension between 30 mN/m and 60 mN/m.

Example 7. The method of one of examples 1 to 6, where the first fluid includes propylene glycol monomethylether (PGME) or propylene glycol monomethylether acetate (PGMEA).

Example 8. The method of one of examples 1 to 7, where the first fluid includes 50-80% propylene glycol monomethylether (PGME) and 20-50% propylene glycol monomethylether acetate (PGMEA), and where the second fluid includes γ-butyrolactone (GBL), n-butyl acetate, or ethyl lactate.

Example 9. A method of processing a wafer that includes: performing a spin-on process to deposit a photoresist film over the wafer; rotating the wafer in a processing chamber; positioning a dispense nozzle assembly over an edge portion of the wafer, the dispense nozzle assembly including a mixing chamber and a dispense nozzle; supplying a first fluid to the mixing chamber through a first supply line at a first flow rate; supplying a second fluid to the mixing chamber through a second supply line at a second flow rate; mixing the first fluid with the second fluid at a mixing ratio within the mixing chamber to form a fluid mixture, the mixing ratio being a volumetric ratio of the first fluid to the second ratio; and while rotating the wafer, dispensing the fluid mixture using the dispense nozzle over an edge portion of the wafer to remove a portion of the photoresist film on the edge portion of the wafer.

Example 10. The method of example 9, where the spin-on process is performed using the first fluid.

Example 11. The method of one of examples 9 or 10, where the first fluid includes 50-80% propylene glycol monomethylether (PGME) and 20-50% propylene glycol monomethylether acetate (PGMEA), and where the second fluid includes γ-butyrolactone (GBL), n-butyl acetate, or ethyl lactate.

Example 12. The method of one of examples 9 to 11, where the photoresist film includes an edge bead at the edge portion of the wafer prior to dispensing the fluid mixture, and where the edge bead is removed during dispensing the fluid mixture.

Example 13. The method of one of examples 9 to 12, further including, while dispensing the fluid mixture, changing the mixing ratio by dynamically controlling the first flow rate and the second flow rate independent of each other.

Example 14. The method of one of examples 9 to 13, further including, after removing the portion of the photoresist film on the edge portion of the wafer, patterning the photoresist film by exposing the wafer to an ultraviolet (UV) irradiation through a photomask.

Example 15. An edge bead removal (EBR) apparatus including: a processing chamber; a wafer chuck configured to support and rotate a wafer; a dispense nozzle assembly including; a mixer configured to receive fluids for mixing; and a nozzle positioned proximate to the mixer to receive the mixed fluids for dispensing; a microprocessor; and a memory having a program to be executed in the microprocessor, the program including instructions to: position the wafer within the processing chamber, the wafer including a film deposited over a surface of the wafer; rotate the wafer within the processing chamber; mix the first fluid with the second fluid at a mixing ratio in the mixer resulting in a fluid mixture, the mixing being performed at a processing temperature; and while rotating the wafer, perform an EBR process by dispensing the fluid mixture from the nozzle over an edge portion of the wafer to remove a portion of the film on the edge portion of the wafer.

Example 16. The EBR apparatus of example 15, further including: a first fluid storage; a second fluid storage; a first fluid supply line configured to controllably supply a first fluid from the first fluid storage to the mixer; a second fluid supply line configured to controllably supply a second fluid from the second storage to the mixer to deliver a selected volume of the second fluid to the mixer; a third fluid supply line configured to supply the first fluid from the first fluid storage to another apparatus; and a controller configured to dynamically control delivery of the first fluid and the second fluid independent of each other.

Example 17. The EBR apparatus of one of examples 15 or 16, where the program includes further instructions to: determine the mixing ratio according to an EBR process recipe for the EBR process, and maintain the mixing ratio while dispensing the fluid mixture.

Example 18. The EBR apparatus of one of examples 15 to 17, where the program includes further instructions to, while dispensing the fluid mixture, change the mixing ratio by dynamically controlling the delivery of the first fluid and the second fluid independent of each other.

Example 19. The EBR apparatus of one of examples 15 to 18, where the EBR apparatus is a part of a track system configured to perform a spin-on process to deposit the film over the wafer.

Example 20. The EBR apparatus of one of examples 15 to 19, where the program includes further instructions to: stop dispensing the fluid mixture; after the stopping, characterize a surface topology of the film at the edge portion of the wafer; and based on the surface topology, update an EBR process recipe for the EBR process, the EBR process recipe including the mixing ratio.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a wafer, the method comprising:

positioning the wafer within a processing chamber, the wafer comprising a film deposited over a surface of the wafer;

rotating the wafer within the processing chamber;

during the processing of the wafer, mixing a first fluid with a second fluid at a mixing ratio at a mixing chamber of a dispense nozzle assembly resulting in a fluid mixture; and while rotating the wafer, dispensing the fluid mixture from the mixing chamber of the dispense nozzle assembly over an edge portion of the wafer through a dispensing nozzle coupled to the mixing chamber, the dispensing removing a portion of the film on the edge portion of the wafer, while dispensing the fluid mixture, changing the mixing ratio based on a surface topology of the film on the edge portion of the wafer.

2. The method of claim 1, further comprising performing a spin-on process to deposit the film over the wafer.

3. The method of claim 1, wherein the first fluid has a first fractional concentration in the fluid mixture based on the mixing ratio, wherein a variation of the first fractional concentration in the fluid mixture during the dispensing on the wafer is between 0.1% and 1%.

4. The method of claim 1, further comprising selecting the second fluid that has a surface tension higher than that of the first fluid at a processing temperature at which the first fluid and the second fluid are being mixed.

5. The method of claim 1, further comprising:

selecting the first fluid that has a surface tension between 10 mN/m and 30 mN/m; and selecting the second fluid that has a surface tension between 30 mN/m and 60 mN/m.

6. The method of claim 1, wherein the first fluid comprises propylene glycol monomethylether (PGME) or propylene glycol monomethylether acetate (PGMEA).

7. The method of claim 1, wherein the first fluid comprises 50-80% propylene glycol monomethylether (PGME) and 20-50% propylene glycol monomethylether acetate (PGMEA), and wherein the second fluid comprises γ-butyrolactone (GBL), n-butyl acetate, or ethyl lactate.

8. A method of processing a wafer, the method comprising:

performing a spin-on process to deposit a photoresist film over the wafer;

rotating the wafer in a processing chamber;

positioning a dispense nozzle assembly over an edge portion of the wafer, the dispense nozzle assembly comprising a mixing chamber and a dispense nozzle;

supplying a first fluid to the mixing chamber through a first supply line at a first flow rate;

supplying a second fluid to the mixing chamber through a second supply line at a second flow rate;

mixing the first fluid with the second fluid at a mixing ratio within the mixing chamber to form a fluid mixture, the mixing ratio being a volumetric ratio of the first fluid to the second fluid; and while rotating the wafer, dispensing the fluid mixture using the dispense nozzle over an edge portion of the wafer to remove a portion of the photoresist film on the edge portion of the wafer, while dispensing the fluid mixture, changing the mixing ratio by dynamically controlling the first flow rate and the second flow rate independent of each other.

9. The method of claim 8, wherein the spin-on process is performed using the first fluid.

10. The method of claim 8, wherein the first fluid comprises 50-80% propylene glycol monomethylether (PGME) and 20-50% propylene glycol monomethylether acetate (PGMEA), and wherein the second fluid comprises γ-butyrolactone (GBL), n-butyl acetate, or ethyl lactate.

11. The method of claim 8, wherein the photoresist film comprises an edge bead at the edge portion of the wafer prior to dispensing the fluid mixture, and wherein the edge bead is removed during dispensing the fluid mixture.

12. The method of claim 8, further comprising, after removing the portion of the photoresist film on the edge portion of the wafer, patterning the photoresist film by exposing the wafer to an ultraviolet (UV) irradiation through a photomask.

13. A method of processing a wafer, the method comprising:

positioning the wafer within a processing chamber, the wafer comprising a film deposited over a surface of the wafer;

rotating the wafer within the processing chamber;

determining a mixing ratio for a first fluid and a second fluid based on an EBR process recipe, the EBR process recipe comprising at least one parameter selected from a solvent system, a mixing ratio, a spin speed, a dispense rate, a temperature, and a position of a dispensing nozzle;

mixing the first fluid with the second fluid at the determined mixing ratio in a mixing chamber of a dispense nozzle assembly to form a fluid mixture; and while rotating the wafer, dispensing the fluid mixture from a dispensing nozzle of the dispense nozzle assembly over an edge portion of the wafer to remove a portion of the film on the edge portion of the wafer, the fluid supplied to the dispensing nozzle from the mixing chamber.

14. The method of claim 13, wherein the dispensing nozzle is attached to the mixing chamber.

15. The method of claim 13, wherein the mixing is performed with laminar flow of the first fluid and the second fluid, and wherein the mixing chamber is a microfluidic mixer.

16. The method of claim 13, further comprising:

stopping dispensing the fluid mixture;

after the stopping, characterizing a surface topology of the film at the edge portion of the wafer; and based on the surface topology, updating the EBR process recipe including the mixing ratio.

17. The method of claim 13, wherein determining the mixing ratio based on the EBR process recipe comprises selecting the EBR process recipe from a plurality of different EBR process recipes based on a type of the film.

18. The method of claim 13, wherein the first fluid comprises 50-80% propylene glycol monomethylether (PGME) and 20-50% propylene glycol monomethylether acetate (PGMEA), and wherein the second fluid comprises γ-butyrolactone (GBL).

* * * * *